United States Patent [19]
Nicol et al.

[11] Patent Number: 4,791,983
[45] Date of Patent: Dec. 20, 1988

[54] SELF-ALIGNING LIQUID-COOLING ASSEMBLY

[75] Inventors: Edward A. Nicol; George J. Adrian, both of San Diego, Calif.

[73] Assignee: Unisys Corporation, Detroit, Mich.

[21] Appl. No.: 108,367

[22] Filed: Oct. 13, 1987

[51] Int. Cl.⁴ .............................................. F28F 7/00
[52] U.S. Cl. .................................... 165/80.4; 165/46; 361/385
[58] Field of Search ........................ 165/80.3, 80.4, 46; 361/385

[56] References Cited

U.S. PATENT DOCUMENTS

| | | | |
|---|---|---|---|
| 4,093,971 | 6/1978 | Chu et al. | 361/385 |
| 4,109,707 | 8/1978 | Wilson et al. | 165/46 |
| 4,193,445 | 3/1980 | Chu et al. | 165/80.4 |
| 4,448,240 | 5/1984 | Sharon | 165/80.4 |
| 4,671,204 | 6/1987 | Ballou | 165/80.4 |

OTHER PUBLICATIONS

Module Board Service Frame, Cannistra et al., IBM Technical Disclosure Bulletin, vol. 20, No. 2, Jul. 1979.

Primary Examiner—James C. Yeung
Attorney, Agent, or Firm—Charles J. Fassbender; L. Joseph Marhoefer

[57] ABSTRACT

An assembly for cooling an array of IC packages which have respective non-coplanar heat dissipating surfaces, comprises: a frame that is attachable to the array and has multiple beams, each of which is positioned to overlie some of the IC packages; respective liquid-cooling jackets for the IC packages with each jacket having a heat absorbing face; each jacket being mounted via a post that is loosely fitted through a respective hole in one of the beams in proximity with a respective one of the IC packages; and each jacket mounting providing a flexible connection which allows the jacket's heat absorbing face to be placed at multiple angles and different heights, and thereby coincide with the non-coplanar heat dissipating surface of an IC package.

11 Claims, 2 Drawing Sheets

4,791,983

SELF-ALIGNING LIQUID-COOLING ASSEMBLY

BACKGROUND OF THE INVENTION

This invention relates to the engineering field of cooling integrated circuit packages (IC packages) with a liquid.

In the prior art, many IC packages (e.g., ten to one hundred) are commonly mounted and interconnected on a printed circuit board. There the IC packages operate in conjunction with one another to perform various predetermined logic functions. For example, they may operate as a digital computer, or as a controller for a disk, or as a dynamic memory, etc. In any case, all IC packages dissipate heat; and so some means is needed to keep them from getting too hot.

IC packages which dissipate just a small amount of heat need only be air-cooled; whereas IC packages which dissipate a large amount of heat must be cooled with some type of liquid-cooling assembly. However, due to various manufacturing tolerances, the orientation of each IC package on a printed circuit board can vary such that the surfaces of the IC packages which need to be cooled have different heights and different angles relative to each other. And for liquid-cooling assemblies, this presents a serious problem for since the differences in orientation can cause an IC package to misalign with its cooling assembly, and thereby produce a high thermal resistance.

Also in assemblies for liquid-cooling IC packages, leaks can often occur due to various defects. Such leaks present another serious problem since they can cause electrical shorts and cause contamination. Further, assemblies for liquid-cooling IC packages tend to be complex and time-consuming to install; and that presents a problem since labor overhead must be minimized to stay competitive. For the same reason, a liquid-cooling assembly which is time-consuming to remove presents a problem since removal occurs whenever one of the IC packages becomes defective and has to be replaced.

Accordingly, a primary object of the invention is to provide a liquid-cooling assembly for IC packages in which all of the above-described problems are overcome.

BRIEF SUMMARY OF THE INVENTION

In accordance with the invention, an assembly is provided for cooling IC packages which have heat dissipating surfaces that are at different heights and different angles relative to each other. This assembly includes—(a) first and second supports which are spaced apart and are attachable to the printed circuit board, (b) multiple beams, each of which is attached to the supports and is positioned to overlie some of the IC packages, (c) respective liquid-cooling jackets for each IC package, and (d) hoses which carry fluid through the jackets. Each beam has several holes which are proximately aligned with a corresponding number of IC packages that the beam overlies; and each liquid-cooling jacket has a guidepost which passes through a respective hole. Also, each post is loosely fitted with its hole such that a heat absorbing face on the corresponding cooling jacket can move up and down and tilt to coincide with a heat dissipating surface of the IC package; and respective springs are compressed between the cooling jackets and the beams to force the heat absorbing face of the cooling jackets against the IC packages.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
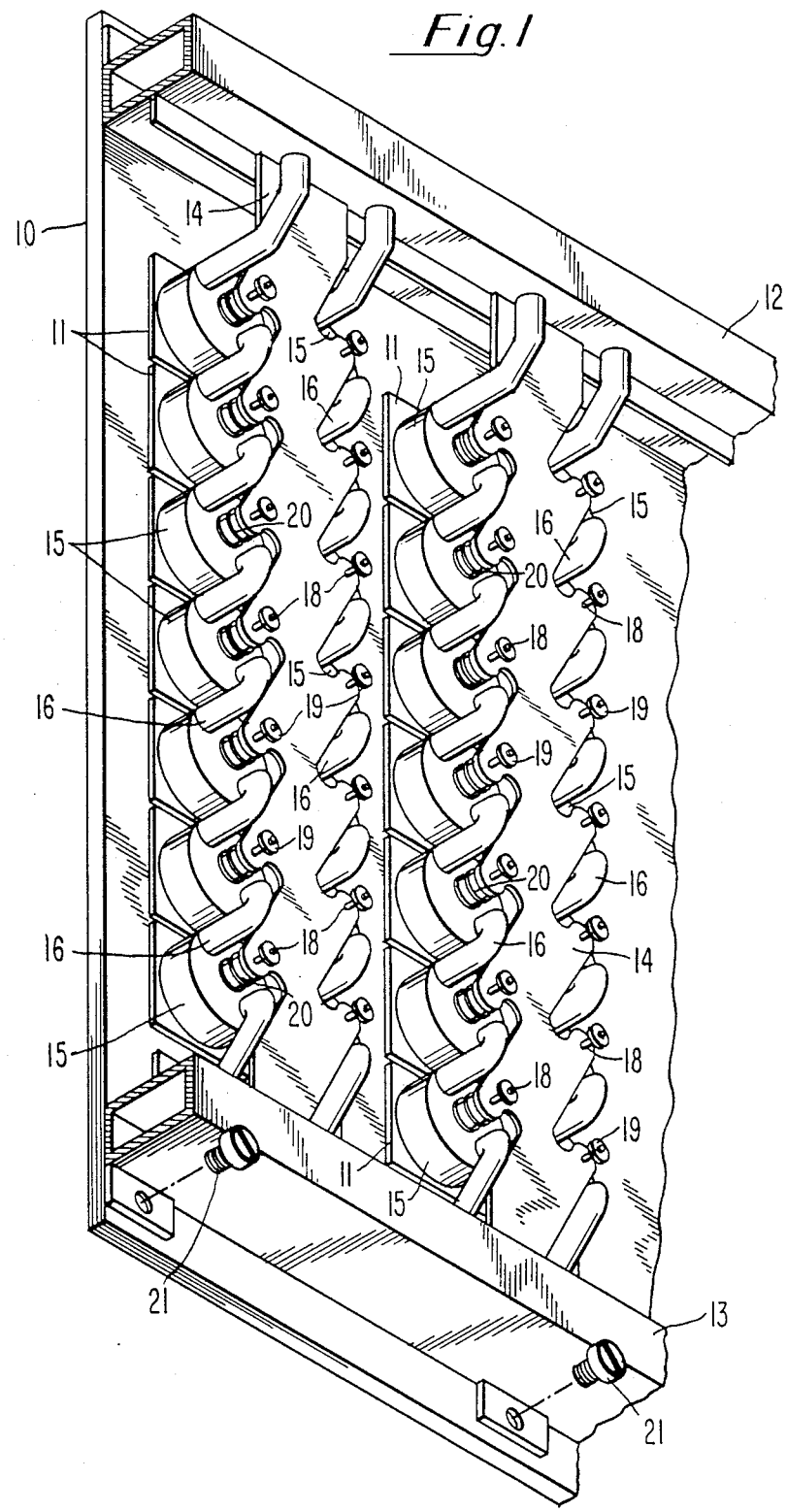
FIG. 1 is a pictorial view of one preferred embodiment of the invention.
Figure 2:
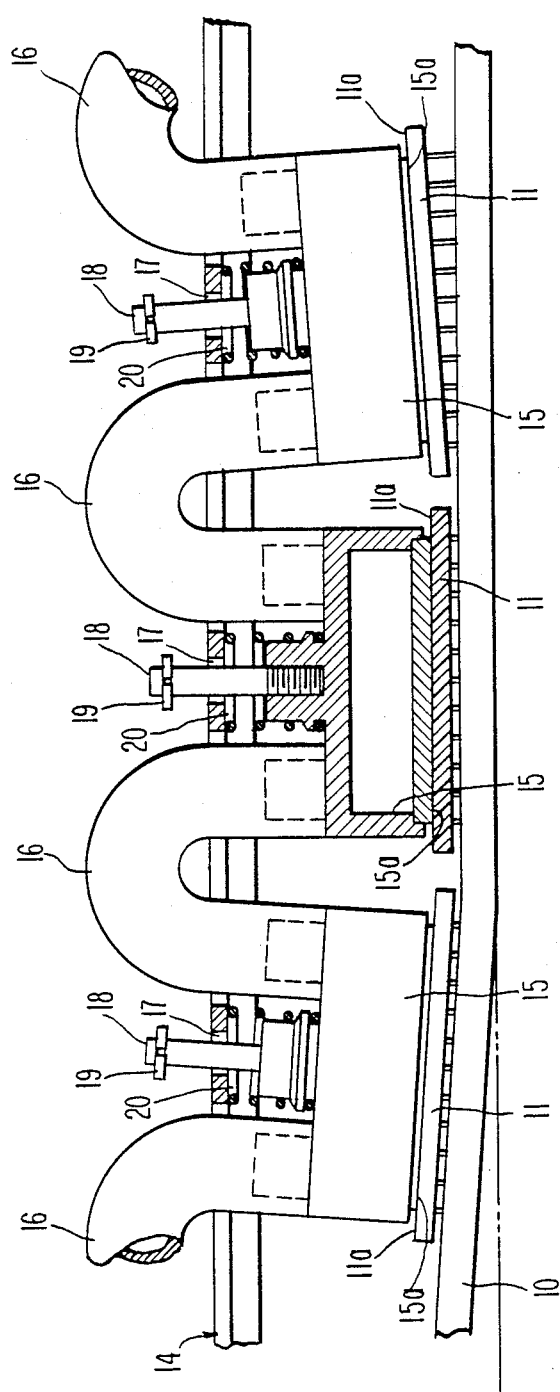
FIG. 2 is an enlarged view of a portion of the embodiment of FIG. 1.

Referring now to FIGS. 1 and 2, the physical makeup of a preferred embodiment of the invention will be described. In those figures, reference numeral 10 indicates a printed circuit board; reference numeral 11 indicates three of the many IC packages that are on the printed circuit board 10; and the remaining reference numerals 12 thru 21 indicate the assembly for cooling the IC packages. In that assembly, the major components include an input manifold 12, an output manifold 13, multiple beams 14, respective liquid-cooling jackets 15 for each of the IC packages, and hoses 16 which carry liquid from the input manifold through the cooling jackets to the output manifold.

Each of the beams 14 is attached at its ends to the manifolds 12 and 13. Also, each of the beams 14 has several holes 17 which are proximately aligned with a corresponding number of IC packages on the printed circuit board. Respective guideposts 18 are press fitted into each of the cooling jackets 15; and each guidepost passes through one of the holes 17.

Each of the IC packages 11 has a heat dissipating face 11a; and the faces 11a of all the IC packages are at different heights and different angles relative to one another. These differences are caused, for example, by (a) the IC package pins not being inserted fully into the plated-through holes of the circuit board, (b) the IC package pins being inserted deeper into the board on one side of the IC package than on the other side, (c) warpage of the circuit board, which may occur during the board fabrication process, or subsequently when the IC packages are soldered to the board, and (d) variations in height of individual finished IC packages.

Typical variations in the height of surface 11a is ±0.016". Factor (a) above typically causes additional height variations of ±0.02". Also due to factor (b) above, the angular orientation of surface 11a can typically be held only within ±5°. Combined with all of this is the bow and twist tolerances for the board itself, which for IPC Class A multi-layer circuit boards is ±5°.

To compensate for all this variation in the orientation of each surface 11a, the guideposts 18 are loosely fitted in their holes. This allows each cooling jacket face 15a to tilt and simultaneously move up and down. Each post also has a retaining ring 19 which keeps the post in its hole. Respective springs 20 are compressed between each of the cooling jackets 15 and the beams 14 to force the heat absorbing face 15a of each cooling jacket against a heat dissipating surface of 11a of an IC package. Preferably, each beam 14 has a T-shaped or "+" shaped cross-section to resist deflection by the compressed springs.

One embodiment of invention incorporates a 0.093' diameter guide post 18 centered in a 0.109' diameter hole 17 in the beam 14. This combination proximately places the cooling jacket 15 over the IC package; and it also permits ±12° of angular freedom for surface 15a, which is in excess of the maximum combined angular misalignment expected for surface 11a.

Heat transfer between each IC package 11 and its cooling jacket 15 is critically dependent on intimate mechanical contact between face 15a of the cooling jacket and face 11a of the IC package. A thin film of thermal grease (e.g. 0.002' thick) can be used between the surfaces 11a and 15a to compensate for surface flatness deviation, but such a film cannot be made thicker to compensate for misalignments caused by factors (a) thru (d) above.

Thermal analysis calculations show that increasing a thermal grease film thickness between the two surfaces 11a and 15a from 0.002' to only 0.004' will increase a typical thermal resistance of 0.50° C. per watt of IC package power to 0.63° C. per watt. Further increase in the grease film thickness caused by a worst-case angular mismatch of 10° (factors "b" and "c") on a 1' square IC package increases the thermal resistance to 5.7° C. per watt, which is catastrophic!

Another important feature of the above described cooling assembly is that it can be manufactured and pressure tested for leaks independent of the printed circuit board 10 of the IC packages 11. That is, components 12 thru 20 can be assembled and a fluid can be passed through them under pressure, prior to their attachment to the printed circuit board. This avoids leaks on the board and the accompanying risk of electrical shorts and contamination. Further, as FIG. 1 illustrates, attachment of the assembly to the board (as well as its removal therefrom) is a quick and simple procedure which only involves the insertion (removal) of a few screws 21 between the manifolds and the board.

A preferred embodiment of the invention has now been described in detail. In addition, however, many changes and modifications can be made to these details without departing from the nature and spirit of the invention. Accordingly, it is to be understood that the invention is not limited to the above details but is defined by the appended claims.

What is claimed is:

1. A liquid cooled assembly of IC packages on a printed circuit board, wherein said packages have respective heat dissipating surfaces which are at different heights and different angles relative to each other, and wherein the cooling portion of said assembly comprises:
   an input manifold and an output manifold, for carrying a liquid, which are spaced apart on said board, such that said IC packages lie there between;
   multiple beams, each of which is attached to said manifolds and overlies several IC packages;
   each beam having holes which are proximately aligned with those packages which it overlies;
   respective liquid cooling jackets for said IC packages, with each jacket having a heat absorbing face;
   hoses which carry liquid from said input manifold through said jackets to said output manifold;
   each jacket including a guide post, which passes through a respective one of said holes in said beams, and a retainer that keeps the post in the hole;
   each post being loosely fitted in its hole such that the heat absorbing face of the corresponding cooling jacket can move up and down and tilt to coincide with said heat dissipating surface of an IC package; and
   respective springs, which are compressed between each of said cooling jackets and the beams to which those jackets are attached, that force each heat absorbing face against a respective heat dissipating surface.

2. An assembly according to claim 1 wherein said springs are coil springs which surround said guide posts.

3. An assembly according to claim 1 wherein said holes in said beams, as well as the guide posts of said cooling jackets which pass through those holes, are disposed in two rows along each beam.

4. An assembly according to claim 1 wherein each beam has a non-rectangular cross section which is shaped to resist deflection by said springs.

5. An assembly according to claim 1 wherein each beam has a T-shaped cross section.

6. An assembly according to claim 1 wherein each heat absorbing face forms a cavity with the corresponding heat dissipating surface through which said liquid passes.

7. An assembly according to claim 1 wherein at least some of said angular differences exceed five degrees, and at least some of said height differences exceed twenty mills.

8. An assembly, for cooling IC packages which are mounted on a printed circuit board and have respective heat dissipating surfaces which are at different heights and different angles relative to each other, comprising:
   first and second supports which are spaced apart and are attachable to said printed circuit board;
   multiple beams, each of which is attached to said supports and is positioned to overlie some of said IC packages;
   each beam having holes which are proximately aligned with those IC packages that it is to overlie;
   respective liquid cooling jackets for each of said IC packages with each jacket having a heat absorbing face;
   each jacket including a guide post which passes through a respective hole in one of said beams and a retainer that keeps the post in the hole; and
   each post being loosely fitted in its hole such that the heat absorbing face of the corresponding cooling jacket can move up and down and tilt to coincide with said heat dissipating surface of an IC package.

9. An assembly according to claim 8 wherein said first support is an input manifold having a single input port and multiple output ports, said second support is an output manifold having multiple input ports and a single output port, and hoses are coupled to carry fluid from said multiple output ports through said cooling jackets and to said multiple input ports.

10. An assembly according to claim 8 wherein respective springs are compressed between each of said jackets and its corresponding beam.

11. An assembly for cooling an array of IC packages which have respective non-planar heat dissipating surfaces, comprising:
   a frame that is attachable to said array and includes multiple beams, each of which is positioned to overlie some of said IC packages;
   respective liquid cooling jackets for said IC packages with each jacket having a heat absorbing face;
   each jacket including a guide post which passes through a respective hole in one of said beams and a retainer that keeps the post in the hole; and
   each post being loosely fitted in its hole such that the heat absorbing face of the corresponding cooling jacket can move up and down and tilt to coincide with said heat dissipating surface of an IC package.

* * * * *